(12) United States Patent
Srinivasa et al.

(10) Patent No.: US 9,021,341 B1
(45) Date of Patent: Apr. 28, 2015

(54) LDPC CODING IN A COMMUNICATION SYSTEM

(75) Inventors: Sudhir Srinivasa, Sunnyvale, CA (US); Hongyuan Zhang, Fremont, CA (US); Rohit U. Nabar, Santa Clara, CA (US)

(73) Assignee: Marvell International Ltd., Hamilton (BM)

( * ) Notice: Subject to any disclaimer, the term of this patent is extended or adjusted under 35 U.S.C. 154(b) by 743 days.

(21) Appl. No.: 13/159,143

(22) Filed: Jun. 13, 2011

Related U.S. Application Data (60) Provisional application No. 61/355,475, filed on Jun. 16, 2010, provisional application No. 61/362,245, filed on Jul. 7, 2010, provisional application No. 61/378,581, filed on Aug. 31, 2010, provisional application No. 61/406,926, filed on Oct. 26, 2010.

(51) Int. Cl.
*H03M 13/00* (2006.01)
*H04L 1/00* (2006.01)
*H03M 13/09* (2006.01)

(52) U.S. Cl.
CPC ............ *H04L 1/0061* (2013.01); *H04L 1/0066* (2013.01); *H04L 1/0057* (2013.01); *H03M 13/09* (2013.01); *H04L 1/0091* (2013.01)

(58) Field of Classification Search
None
See application file for complete search history.

(56) References Cited

U.S. PATENT DOCUMENTS

| | | | |
|---|---|---|---|
| 7,599,332 B2 | 10/2009 | van Zelst et al. | |
| 7,742,390 B2 | 6/2010 | Mujtaba | |
| 8,331,419 B2 | 12/2012 | Zhang et al. | |
| 8,335,153 B2 * | 12/2012 | Ichihara et al. | 370/208 |
| 8,526,295 B2 * | 9/2013 | Lin et al. | 370/203 |
| 8,527,853 B2 | 9/2013 | Lakkis | |

(Continued)

FOREIGN PATENT DOCUMENTS

| | | |
|---|---|---|
| WO | WO-2006/007571 A1 | 1/2006 |
| WO | WO-2009/059229 A1 | 5/2009 |

OTHER PUBLICATIONS

Gunnam, et al., "Multi-Rate Layered Decoder Architecture for Block LDPC Codes of the IEEE 802.11n Wireless Standard," IEEE International Symposium on Circuits and Systems, 2007 (ISCAS 2007), pp. 1645-1648 (2007).

(Continued)

*Primary Examiner* — Daniel McMahon (57) ABSTRACT

In a method for generating a physical layer (PHY) data unit for transmission via a communication channel, a plurality of information bits to be included in the PHY data unit are received, and a number of orthogonal frequency division multiplexing (OFDM) symbols that are needed to include the plurality of information bits after encoding with a low density parity check (LDPC) encoder is determined. One or more of a, b, c, and d are performed according to a set of rules so that a receiving device can determine a number of information bits in the PHY data unit based on i) an indication of the number of OFDM symbols, and ii) the set rules: a) adding padding bits and/or shortening bits prior to encoding with the LDPC encoder, b) removing shortening bits after encoding with the LDPC encoder, c) removing parity bits after encoding with the LDPC encoder, d) repeating information and/or parity bits after encoding with the LDPC encoder. The plurality of information bits are encoded using the LDPC encoder. The PHY data unit is generated i) to include the LDPC encoded information bits in OFDM symbols and ii) to include an indication of the number of OFDM symbols in the PHY data unit.

8 Claims, 5 Drawing Sheets

(56) References Cited

U.S. PATENT DOCUMENTS

| | | | | |
|---|---|---|---|---|
| 8,553,751 | B2* | 10/2013 | Kobayashi | 375/224 |
| 8,619,907 | B2 | 12/2013 | Mujtaba et al. | |
| 2006/0218459 | A1* | 9/2006 | Hedberg | 714/752 |
| 2007/0041458 | A1* | 2/2007 | Hocevar et al. | 375/260 |
| 2007/0094580 | A1* | 4/2007 | Livshitz | 714/779 |
| 2007/0140364 | A1 | 6/2007 | Ouyang et al. | |
| 2008/0008083 | A1* | 1/2008 | Stolpman et al. | 370/206 |
| 2008/0298435 | A1 | 12/2008 | Lakkis | |
| 2009/0196163 | A1* | 8/2009 | Du | 370/204 |
| 2009/0323850 | A1 | 12/2009 | van Nee | |
| 2010/0046358 | A1 | 2/2010 | van Nee | |
| 2010/0091675 | A1 | 4/2010 | Sawai | |
| 2010/0260159 | A1 | 10/2010 | Zhang et al. | |
| 2010/0309834 | A1 | 12/2010 | Fischer et al. | |
| 2011/0002219 | A1 | 1/2011 | Kim et al. | |
| 2011/0026623 | A1 | 2/2011 | Srinivasa et al. | |
| 2011/0051845 | A1* | 3/2011 | Schmidl et al. | 375/299 |
| 2012/0236916 | A1* | 9/2012 | Kobayashi | 375/224 |
| 2012/0314711 | A1* | 12/2012 | Trachewsky et al. | 370/393 |
| 2013/0107990 | A1* | 5/2013 | Zhang et al. | 375/329 |
| 2013/0170539 | A1* | 7/2013 | Huang et al. | 375/232 |

OTHER PUBLICATIONS

IEEE Std 802.11a-1999 (Supplement to IEEE Std 802.11-1999) "Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications: High-Speed Physical Layer in the 5 GHZ Band," *The Institute of Electrical and Electronics Engineers, Inc.*, (1999).

IEEE Std 802.11b-2001 (Corrigendum to IEEE Std 802.11b-1999) "IEEE Standard for Information technology—Telecommunications and information exchange between systems—Local and metropolitan area networks—Specific requirements, Part 11: Wireless LAN Medium Access Control (MAC) and Physical Layer (PHY) specifications, Amendment 2: Higher-speed Physical Layer (PHY) extension in the 2.4 GHz band-Corrigendum 1," *The Institute of Electrical and Electronics Engineers, Inc.*, Nov. 7, 2001.

IEEE Std 802.11g/D8.2, Apr. 2003 (Supplement to ANSI/IEEE Std 802.11, 1999 (Reaff 2003)) "Draft Supplement to Standard [for] Information technology—Telecommunications and information exchange between systems—Local and metropolitan area networks—Specific requirements, Part 11: Wireless LAN Medium Access Control (MAC) and Physical Layer (PHY) specifications: Further Higher Data Rate Extension in the 2.4 GHz Band," *The Institute of Electrical and Electronics Engineers, Inc.*, Apr. 2003.

S.A. Mujtaba, "IEEE P802.11—Wireless LANs, TGn Sync Proposal Technical Specification," *The Institute of Electrical and Electronics Engineers, Inc.*, doc.: IEEE 802.11-04/0889r6, May 2005.

"IEEE P802.11n™/D3.00, Draft Standard for Information Technology—Telecommunications and information exchange between systems—Local and metropolitan area networks—Specific requirements, Part.11: Wireless LAN Medium Access Control (MAC) and Physical Layer (PHY) specifications: Amendment 4: Enhancements for Higher Throughput," *The Institute of Electrical and Electronics Engineers, Inc.*, Sep. 2007.

"IEEE Std. 802.11n™ IEEE Standard for Information Technology—Telecommunications and information exchange between systems—Local and metropolitan area networks—Specific requirements, Part 11: Wireless LAN Medium Access Control (MAC) and Physical Layer (PHY) Specifications: Amendment 5: Enhancements for Higher Throughput," *The Institute of Electrical and Electronics Engineers, Inc.*, Oct. 2009.

IEEE Std 802.11-2007 (revision of IEEE Std. 802.11-1999) "Information Standard for Information technology—Telecommunications and information exchange between systems—Local and metropolitan area networks—Specific requirements" Part 11: Wireless LAN Medium Access Control (MAC) and Physical Layer (PHY) Specifications, *The Institute of Electrical and Electronics Engineers, Inc.*, pp. 1-1184 (Jun. 12, 2007).

Stacey et al., "IEEE P802.11, Wireless LANs, Proposed TGac Draft Amendment," Institute of Electrical and Electronics Engineers, doc. No. IEEE 802.11-10/1361r3 pp. 1-154 (Jan. 2011).

Stacey et al., "Specification Framework for TGac," document No. IEEE 802.11-09/0992r20, Institute for Electrical and Electronics Engineers, pp. 1-49, (Jan. 18, 2011).

Perahia, et al., "Gigabit Wireless LANs: an overview of IEEE 802.11ac and 80211 ad," ACM SIGMOBILE Mobile Computing and Communications Review, vo. 15, No. 3, pp. 23-33 (Jul. 2011).

Harada, "Project: IEEE P802.15 Working Group for Wireless Personal Area Network (WPANs)," IEEE 802.15/07/0693-003c, slides 24-33 (May 2007).

* cited by examiner

LDPC CODING IN A COMMUNICATION SYSTEM

CROSS-REFERENCES TO RELATED APPLICATIONS

This disclosure claims the benefit of the following U.S. Provisional Patent Applications:

U.S. Provisional Patent Application No. 61/355,475, filed on Jun. 16, 2010;

U.S. Provisional Patent Application No. 61/362,245, filed on Jul. 7, 2010;

U.S. Provisional Patent Application No. 61/378,581, filed on Aug. 31, 2010;

U.S. Provisional Patent Application No. 61/406,926, filed on Oct. 26, 2010.

The disclosures of all of the above-referenced patent applications are hereby incorporated by reference herein in their entireties.

FIELD OF THE DISCLOSURE

The present disclosure relates generally to communication networks and, more particularly, to communicating device capabilities between devices in a wireless network.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Development of wireless local area network (WLAN) standards such as the Institute for Electrical and Electronics Engineers (IEEE) 802.11a, 802.11b, 802.11g, and 802.11n Standards, has improved single-user peak data throughput. For example, the IEEE 802.11b Standard specifies a single-user peak throughput of 11 megabits per second (Mbps), the IEEE 802.11a and 802.11g Standards specify a single-user peak throughput of 54 Mbps, and the IEEE 802.11n Standard specifies a single-user peak throughput of 600 Mbps. Work has begun on a new standard, IEEE 802.11ac, that promises to provide even greater throughput.

SUMMARY

In an embodiment, a method for generating a physical layer (PHY) data unit for transmission via a communication channel includes receiving a plurality of information bits to be included in the PHY data unit, determining a number of orthogonal frequency division multiplexing (OFDM) symbols that are needed to include the plurality of information bits after encoding with a low density parity check (LDPC) encoder, and performing one or more of a, b, c, and d according to a set of rules so that a receiving device can determine a number of information bits in the PHY data unit based on i) an indication of the number of OFDM symbols, and ii) the set rules: a) adding padding bits and/or shortening bits prior to encoding with the LDPC encoder, b) removing shortening bits after encoding with the LDPC encoder, c) removing parity bits after encoding with the LDPC encoder, d) repeating information and/or parity bits after encoding with the LDPC encoder. The method also includes encoding the plurality of information bits using the LDPC encoder. The method further includes generating the PHY data unit i) to include the LDPC encoded information bits in OFDM symbols and ii) to include an indication of the number of OFDM symbols in the PHY data unit.

In another embodiment, a communication device includes a network interface configured to receive a plurality of information bits to be included in a physical layer (PHY) data unit for transmission via a wireless communication channel, determine a number of orthogonal frequency division multiplexing (OFDM) symbols that are needed to include the plurality of information bits after encoding with a low density parity check (LDPC) encoder, and perform one or more of a, b, c, and d according to a set of rules so that a receiving device can determine a number of information bits in the PHY data unit based on i) an indication of the number of OFDM symbols, and ii) the set rules: a) add padding bits and/or shortening prior to encoding with the LDPC encoder, b) remove shortening bits after encoding with the LDPC encoder, c) remove parity bits after encoding with the LDPC encoder, d) repeat information and/or parity bits after encoding with the LDPC encoder. The network interface is further configured to encode the plurality of information bits using the LDPC encoder, and generate the PHY data unit i) to include the LDPC encoded information bits in OFDM symbols and ii) to include an indication of the number of OFDM symbols in the PHY data unit.

In another embodiment, a method for decoding information bits included in a physical layer (PHY) data unit received via a communication channel includes receiving the PHY data unit, determining a number of orthogonal frequency division multiplexing (OFDM) symbols corresponding to low density parity check (LDPC) encoded information bits in the PHY data unit based on an indicator in a header of the PHY data unit, and performing one or more of a, b, and c according to a set of rules and based on the number of OFDM symbols: a) removing padding and/or shortening bits after decoding with an LDPC decoder, b) adding shortening bits prior to decoding with the LDPC decoder, c) removing repeated information and/or parity bits prior to decoding with the LDPC decoder. The method further includes decoding the plurality of information bits using the LDPC decoder, and recovering the information bits from an output of the LDPC decoder.

In another embodiment, a communication device includes a network interface configured to receive a physical layer (PHY) data unit, determine a number of orthogonal frequency division multiplexing (OFDM) symbols corresponding to low density parity check (LDPC) encoded information bits in the PHY data unit based on an indicator in a header of the PHY data unit, and perform one or more of a, b, and c according to a set of rules and based on the number of OFDM symbols: a) removing padding and/or shortening bits after decoding with an LDPC decoder, b) adding shortening bits prior to decoding with the LDPC decoder, c) removing repeated information and/or parity bits prior to decoding with the LDPC decoder. The network interface is further configured to decode the plurality of information bits using the LDPC decoder, and recover the information bits from an output of the LDPC decoder.

DETAILED DESCRIPTION

In embodiments described below, a wireless network device such as an access point (AP) of a wireless local area network (WLAN) transmits data streams to one or more client stations. The data streams transmitted by the AP to the client stations are encoded using various coding schemes, according to various embodiments and/or scenarios. In some embodiment and/or scenarios, binary convolutional codes (BCC) are utilized for encoding data streams. Alternatively, in other embodiments and/or scenarios, the data streams are encoded using block-based codes, such as, for example, low density parity check (LDPC) codes. Generally, in order to properly decode a data unit, a client station requires knowledge of the type of coding utilized, along with other information regarding the data unit, such as, for example, the number of information bits included in the data unit. Accordingly, in an embodiment, the AP includes, in the header (or preamble) portion of the data unit, an indication of the particular code type utilized to encode the data unit and the number of information bits included in the data unit. However, in some embodiments, the header portion of a data unit includes an indication of the number of symbols used to transmit the data unit rather than the exact number of information bits in the data unit. In such embodiments, various techniques described herein are utilized to encode the data unit such that a client station is nonetheless able to unambiguously decode the data unit.

Figure 1:
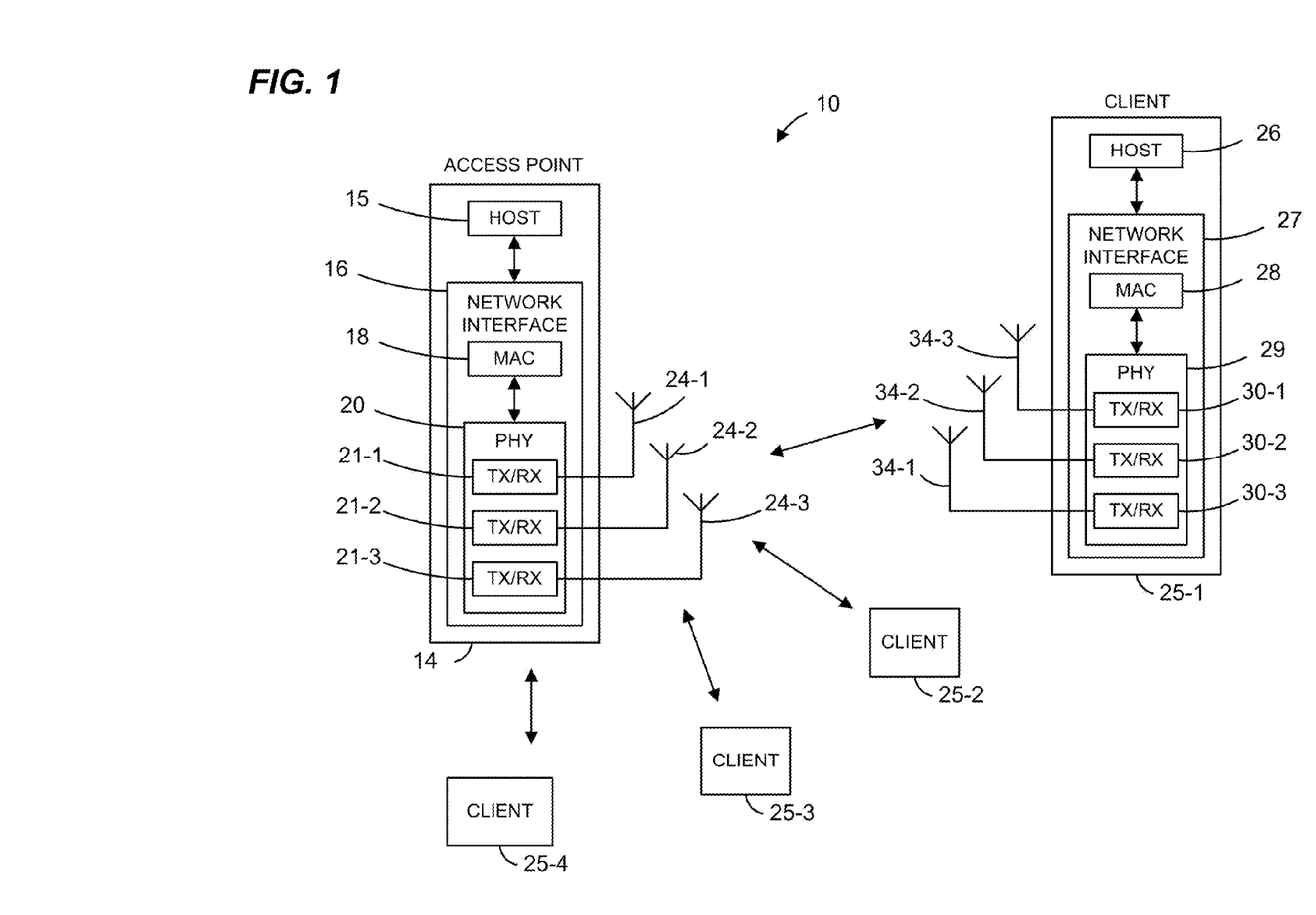
FIG. 1 is a block diagram of an example wireless communication network in which radio link monitoring techniques are utilized, according to an embodiment.

FIG. 1 is a block diagram of an example wireless local area network (WLAN) 10, according to an embodiment. An AP 14 includes a host processor 15 coupled to a network interface 16. The network interface 16 includes a medium access control (MAC) processing unit 18 and a physical layer (PHY) processing unit 20. The PHY processing unit 20 includes a plurality of transceivers 21, and the transceivers are coupled to a plurality of antennas 24. Although three transceivers 21 and three antennas 24 are illustrated in FIG. 1, the AP 14 can include different numbers (e.g., 1, 2, 4, 5, etc.) of transceivers 21 and antennas 24 in other embodiments. In one embodiment, the MAC processing unit 18 and the PHY processing unit 20 are configured to operate according to a first communication protocol. The first communication protocol is also referred to herein as a very high throughput (VHT) protocol. In another embodiment, the MAC unit processing 18 and the PHY processing unit 20 are also configured to operate according to at least a second communication protocol (e.g., the IEEE 802.11n Standard, the IEEE 802.11g Standard, the IEEE 802.11a Standard, etc.).

The WLAN 10 includes a plurality of client stations 25. Although four client stations 25 are illustrated in FIG. 1, the WLAN 10 can include different numbers (e.g., 1, 2, 3, 5, 6, etc.) of client stations 25 in various scenarios and embodiments. At least one of the client stations 25 (e.g., client station 25-1) is configured to operate at least according to the first communication protocol.

The client station 25-1 includes a host processor 26 coupled to a network interface 27. The network interface 27 includes a MAC processing unit 28 and a PHY processing unit 29. The PHY processing unit 29 includes a plurality of transceivers 30, and the transceivers 30 are coupled to a plurality of antennas 34. Although three transceivers 30 and three antennas 34 are illustrated in FIG. 1, the client station 25-1 can include different numbers (e.g., 1, 2, 4, 5, etc.) of transceivers 30 and antennas 34 in other embodiments.

In an embodiment, one or all of the client stations 25-2, 25-3 and 25-4 has a structure the same as or similar to the client station 25-1. In these embodiments, the client stations 25 structured the same as or similar to the client station 25-1 have the same or a different number of transceivers and antennas. For example, the client station 25-2 has only two transceivers and two antennas, according to an embodiment.

In various embodiments, the PHY processing unit 20 of the AP 14 is configured to generate data units conforming to the first communication protocol. The transceiver(s) 21 is/are configured to transmit the generated data units via the antenna(s) 24. Similarly, the transceiver(s) 24 is/are configured to receive the data units via the antenna(s) 24. The PHY processing unit 20 of the AP 14 is configured to process received data units conforming to the first communication protocol, according to an embodiment.

In various embodiments, the PHY processing unit 29 of the client device 25-1 is configured to generate data units conforming to the first communication protocol. The transceiver(s) 30 is/are configured to transmit the generated data units via the antenna(s) 34. Similarly, the transceiver(s) 30 is/are configured to receive data units via the antenna(s) 34. The PHY processing unit 29 of the client device 25-1 is configured to process received data units conforming to the first communication protocol, according to an embodiment.

Figure 2:
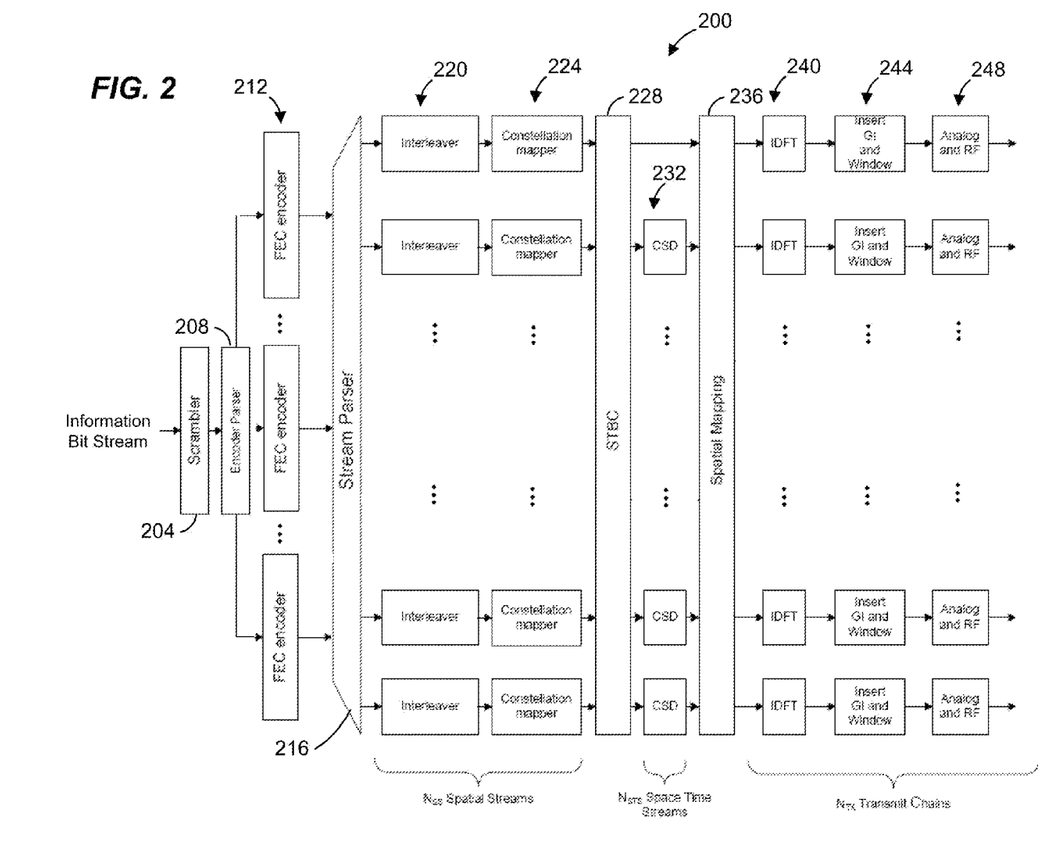
FIG. 2 is a block diagram of an example physical layer (PHY) processing unit, according to an embodiment.

FIG. 2 is a block diagram of an example PHY processing unit 200 configured to operate according to the VHT protocol, according to an embodiment. Referring to FIG. 1, the AP 14 and the client station 25-1, in one embodiment, each include a PHY processing unit such as the PHY processing unit 200.

The PHY unit 200 includes a scrambler 204 that generally scrambles an information bit stream to reduce the occurrence of long sequences of ones or zeros, according to an embodiment. In another embodiment, the scrambler 204 is replaced with a plurality of parallel scramblers located after an encoder parser 208. In this embodiment, each of the parallel scramblers has a respective output coupled to a respective one of a plurality of FEC encoders 212. The plurality of parallel scramblers operate simultaneously on a demultiplexed stream. In yet another embodiment, the scrambler 204 comprises a plurality of parallel scramblers and a demultiplexer that demultiplexes the information bit stream to the plurality of parallel scramblers, which operate simultaneously on demultiplexed streams. These embodiments may be useful, in some scenarios, to accommodate wider bandwidths and thus higher operating clock frequencies.

The encoder parser 208 is coupled to the scrambler 204. The encoder parser 208 demultiplexes the information bit stream into one or more encoder input streams corresponding to one or more FEC encoders 212. In another embodiment with a plurality of parallel scramblers, the encoder parser 208 demultiplexes the information bit stream into a plurality of streams corresponding to the plurality of parallel scramblers.

Each encoder 212 encodes the corresponding input stream to generate a corresponding encoded stream. In one embodiment, each FEC encoder 212 includes a binary convolutional encoder. In another embodiment, each FEC 212 encoder includes a binary convolutional encoder followed by a puncturing block. In another embodiment, each FEC encoder 212 includes a low density parity check (LDPC) encoder. In yet another embodiment, each FEC encoder 212 additionally includes a binary convolutional encoder followed by a puncturing block. In this embodiment, each FEC encoder 212 is configured to implement any of: 1) binary convolutional encoding without puncturing; 2) binary convolutional encoding with puncturing; or 3) LDPC encoding.

A stream parser 216 parses the one or more encoded streams into one or more spatial streams for separate interleaving and mapping into constellation points. Corresponding to each spatial stream, an interleaver 220 interleaves bits of the spatial stream (i.e., changes the order of the bits) to prevent long sequences of adjacent noisy bits from entering a decoder at the receiver. Also corresponding to each spatial stream, a constellation mapper 224 maps an interleaved sequence of bits to constellation points corresponding to different subcarriers of an orthogonal frequency division multiplexing (OFDM) symbol. More specifically, for each spatial stream, the constellation mapper 224 translates every bit sequence of length $\log_2(M)$ into one of M constellation points. The constellation mapper 224 handles different numbers of constellation points depending on the modulation and coding scheme (MCS) being utilized. In an embodiment, the constellation mapper 224 is a quadrature amplitude modulation (QAM) mapper that handles M=2, 4, 16, 64, 256, and 1024. In other embodiments, the constellation mapper 224 handles different modulation schemes corresponding to M equaling different subsets of at least two values from the set {2, 4, 16, 64, 256, 1024}.

In an embodiment, a space-time block coding unit 228 receives the constellation points corresponding to the one or more spatial streams and spreads the spatial streams to a greater number of space-time streams. In some embodiments, the space-time block coding unit 228 is omitted. A plurality of CSD units 232 are coupled to the space-time block unit 228. The CSD units 232 insert cyclic shifts into all but one of the space-time streams (if more than one space-time stream) to prevent unintentional beamforming. For ease of explanation, the inputs to the CSD units 232 are referred to as space-time streams even in embodiments in which the space-time block coding unit 228 is omitted.

A spatial mapping unit 236 maps the space-time streams to transmit chains. In various embodiments, spatial mapping includes one or more of; 1) direct mapping, in which constellation points from each space-time stream are mapped directly onto transmit chains (i.e., one-to-one mapping); 2) spatial expansion, in which vectors of constellation point from all space-time streams are expanded via matrix multiplication to produce inputs to the transmit chains; and 3) beamforming, in which each vector of constellation points from all of the space-time streams is multiplied by a matrix of steering vectors to produce inputs to the transmit chains.

Each output of the spatial mapping unit 236 corresponds to a transmit chain, and each output of the spatial mapping unit 236 is operated on by an IDFT unit 240 that converts a block of constellation points to a time-domain signal. Outputs of the IDFT units 240 are provided to GI insertion and windowing units 244 that prepend, to each OFDM symbol, a guard interval (GI) portion, which is a circular extension of the OFDM symbol in an embodiment, and smooth the edges of each symbol to increase spectral decay. Outputs of the GI insertion and windowing units 244 are provided to analog and RF units 248 that convert the signals to analog signals and upconvert the signals to RF frequencies for transmission. The signals are transmitted in a 20 MHz, a 40 MHz, an 80 MHz, a 120 MHz, or a 160 MHz bandwidth channel, in various embodiments and/or scenarios.

In various embodiments and/or scenarios in which one or more of the FEC encoders 212 are configured to implement LDPC encoding, the FEC encoders 212 utilize one or more codeword lengths defined in the VHT protocol for LDPC encoding. For example, in an embodiment, three possible codeword lengths are defined for the VHT protocol, and the specific codeword lengths are 648 bits, 1296 bits and 1944 bits. In another embodiment, only one of the 648 bits, 1296 bits, or 1944 bits codeword lengths is utilized. In other embodiments, one or more other suitable codeword lengths are defined. Generally, longer data units are encoded using longer codewords, in various embodiments and/or scenarios. Further, in some embodiments, a plurality of codes is defined for each of the one or more of the codeword lengths. For example, in one embodiment, a plurality of code rates is defined (the particular code rate determined by the MCS being utilized), and for each of the one or more codeword lengths, a plurality of LDPC codes is defined corresponding to the plurality of code rates. In one embodiment, the LDPC codes are defined as in the IEEE 802.11n Standard. In another embodiment, the LDPC codes are defined as in the IEEE 802.11n Standard, but using only one of multiple codeword lengths defined in the IEEE 802.11n Standard. In another embodiment, one or more other suitable LDPC codes are defined by the VHT protocol different than those defined by the IEEE 802.11n Standard.

Figure 3:
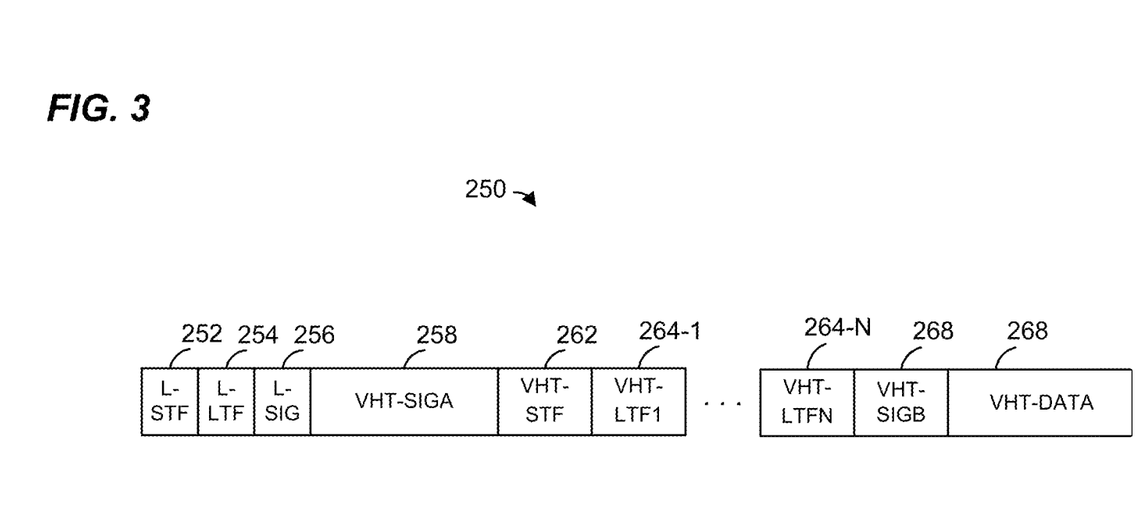
FIG. 3 is a diagram of an example data unit format, according to an embodiment.

FIG. 3 is a diagram of a data unit 250 that the AP 14 is configured to transmit to the client station 25-1, according to an embodiment. In an embodiment, the client station 25-1 is also configured to transmit data units of the format of FIG. 3 to the AP 14. In an embodiment, the data unit 250 is generated by the PHY processing unit 200. The data unit 250 includes a preamble having an L-STF field 252, an L-LTF field 254, an L-SIG field 256, a first very high throughput signal field (VHT-SIGA) 258, a very high throughput short training field (VHT-STF) 262, N very high throughput long training fields (VHT-LTFs) 264, where N is an integer, and a second very high throughput signal fields (VHT-SIGB) 268. The data unit 250 also includes a data portion 272. The data portion 272 includes service bits and information bits (not shown).

In an embodiment, the preamble portion of the data unit 250 includes an indication of the coding type utilized by the FEC encoder 212 (FIG. 2) to encode the data unit. For example, the VHT-SIGA subfield 258 of the data unit 250 includes a bit that is set to zero (0) if the FEC encoders 212 utilize BCC encoding, and is set to one (1) if the FEC encoders 212 utilize LDPC encoding, according to an embodiment. Further, in an embodiment, the preamble portion of the data unit 250 includes an indication of the number of information bits included in the data unit. In one embodiment, the VHT-SIGA 258 and/or the VHT-SIGB 268 include an indication of the exact number of information bits included in the data unit. In another embodiment, the L-SIG field 256 includes a field to indicate the number of OFDM symbols included in the data unit. In some embodiments and/or scenarios in which FEC encoders 212 utilize BCC encoding, padding is utilized to allow the data unit to be transmitted in an integer number of OFDM symbols. Various example padding techniques that are utilized in some embodiments of the present disclosure in which BCC coding is utilized are described in U.S. patent application Ser. No. 12/846,681, entitled "Methods and Apparatus for WLAN Transmission", filed on Jul. 29, 2010, which is hereby incorporated by reference herein in its entirety.

In various embodiments the VHT protocol defines a set of rules that allows a data unit encoded utilizing the various LDPC codes defined by the VHT protocol to be properly decoded at the receiver. In some such embodiments, the set of rules is based on the number of OFDM symbols used to generate the data unit. Consequently, in some embodiments, one or more of padding, shortening, repeating and puncturing are utilized according to the set of rules in order to match the number of information bits to an integer number of OFDM symbols needed to transmit the encoded data unit and thus allow the client station 25-1 and/or the AP 14 to determine the exact number of information bits included in the data unit and unambiguously determine the particular LDPC code needed to decode the data unit. In some embodiments, puncturing is avoided to simplify preprocessing and thereby decrease encoding and/or decoding time.

According to one embodiment, in order to determine the appropriate number of padding or shortening bits, the PHY processing unit 200 calculates the minimum number of codewords required to encode the information bits according to:

$$N_{CW}^{min} = \left\lceil \frac{(8L + N_{service})}{L_{CW}R} \right\rceil \quad \text{Equation 1}$$

where L is the number of information bits, $N_{service}$ is a number of service bits, $L_{CW}$ is a codeword length, R is a coding rate defined by a particular MCS being utilized, and $\lceil\ \rceil$ denotes the integer ceiling function. In an embodiment, the PHY processing unit 200 calculates a number of bits that do not fit into the minimum number of codewords according to:

$$x = (8L + N_{service}) - N_{CW}^{min} L_{CW} R \quad \text{Equation 2}$$

In the case that x is equal to 0, i.e., the number of information bits exactly fits into the minimum number of codewords, the number of symbols needed to transmit the data unit is determined, in an embodiment, according to:

$$N_{SYM} = \left\lceil \frac{(N_{CW}^{min} L_{CW})}{N_{CBPS}} \right\rceil \quad \text{Equation 3}$$

where $N_{CBPS}$ is a number of coded bits per symbol. In this case, the data unit is split into the minimum number of codewords ("blocks"), calculated in Equation 1, and the blocks are encoded and transmitted over the $N_{SYM}$ symbols. On the other hand, in the case that x is not equal to 0, i.e. the number of information bits is such that the information bits do not exactly fit into an integer number of symbols, the PHY processing unit 200 determines, in an embodiment, a number of symbols needed to transmit the data stream according to:

$$N_{SYM} = \left\lceil \frac{(N_{CW}^{min} L_{CW} + (x + L_{parity}))}{N_{CBPS}} \right\rceil \quad \text{Equation 4}$$

where $L_{parity}$ is a number of parity bits per codeword. In an embodiment, the PHY processing unit 200 determines a number of extra coded bits (i.e., bits after coding) needed to reach the last OFDM symbol boundary according to:

$$y = N_{SYM} N_{CBPS} - N_{CW}^{unshort} L_{CW} - (x + L_{parity}) \quad \text{Equation 5}$$

In an embodiment, the number of additional codewords needed is determined, according to:

$$N_{CW}^{extra} = \left\lfloor \frac{x + L_{parity} + y}{L_{CW}} \right\rfloor \quad \text{Equation 6}$$

In equation 6, $\lfloor\ \rfloor$ denotes the integer floor function. The number of padding bits to be added before encoding based on the number of additional required codewords is determined according to:

$$p_1 = N_{CW}^{extra} L_{CW} R - x \quad \text{Equation 7}$$

The PHY processing unit determines a number of additional coded bits to reach the data unit boundary according to:

$$z = (x + L_{parity}) + y - N_{CW}^{extra} L_{CW} = N_{SYM} N_{CBPS} - (N_{CW}^{min} + N_{CW}^{extra}) L_{CW} \quad \text{Equation 8}$$

If z is less than or equal to $L_{parity}$, z number of bits is repeated in order to match the number of coded bits with the number of transmitted OFDM symbols, according to an embodiment. In one such embodiment, $p_1$ padding bits are added to the $(8L + N_{service})$ information bits prior to encoding, where $p_1$ is determined according to:

$$p = (N_{CW}^{min} + N_{CW}^{extra}) L_{CW} R - x = (N_{CW}^{min} + N_{CW}^{extra}) L_{CW} R - (8L + N_{service}) \quad \text{Equation 9}$$

Continuing with the same embodiment, if z is greater or equal to $N_{CW}^{min} + N_{CW}^{extra}$, information and/or parity bits are repeated after encoding in each codeword so that encoded and padded information bits fit in the determined number of OFDM symbols ($N_{SYM}$). Alternatively, if z is less than $N_{CW}^{min} + N_{CW}^{extra}$, then one information or parity bit is repeated after each of the first z codewords.

Further, if z is greater than $L_{parity}$, an additional codeword is utilized, according to an embodiment. In this embodiment, p padding bits are added to the $8L + N_{service}$ information bits prior to encoding, where p is determined according to:

$$p = p_1 + z - L_{parity} = N_{SYM} N_{CBPS} - N_{CW}^{min} + L_{CW}(x + L_{parity}) \quad \text{Equation 10}$$

A number of shortening bits is then determined, in an embodiment, according to:

$$N_{shrt} = L_{CW} - z \quad \text{Equation 11}$$

In an embodiment, the $N_{shrt}$ shortening bits are distributed equally among $(N_{CW}^{min} + N_{CW}^{extra} + 1)$ codewords to be transmitted. Alternatively, in another embodiment, the $N_{shrt}$ shortening bits are not distributed equally among all codewords, but are distributed among all or a number of codewords in another suitable way. In any case, the receiver is able to properly decode a data unit based on a rule or a set of rules defined for distribution of the shortening bits among codewords. In an embodiment, the shortening bits are discarded after encoding.

Encoding a data unit according to the encoding flow described by equations 1-11 allows unambiguous decoding at the receiver if a set of rules is applied at the receiver. For example, in an embodiment, the receiver determines:

$$z = \text{mod}(N_{SYM} N_{CBPS}, L_{CW}) \quad \text{Equation 12}$$

In the case that z is less than or equal to $L_{parity}$, the receiver determines that there are z repetition bits which are to be distributed among all or some of the codewords:

$$\text{PSDU\_LENGTH}_u = \left\lfloor \frac{N_{SYM} N_{CBPS} - z}{8} \right\rfloor \quad \text{Equation 13}$$

On the other hand, if z is greater than $L_{parity}$, then the receiver determines that there are $z - L_{parity}$ shortening bits which are distributed across all or some codewords:

$$\text{PSDU\_LENGTH}_u = \left\lfloor \frac{N_{SYM} N_{CBPS} - z + L_{parity}}{8} \right\rfloor \quad \text{Equation 14}$$

According to an embodiment, the determined number of padding bits is discarded at the receiver during the decoding process.

Generally, a receiver is able to determine the number of pre-encoded padding bits in the last codeword based on the particular MCS utilized and the particular codeword length. Accordingly in some embodiments, the pre-encoded and post-encoded bits are not transmitted, but are replaced by one or more codewords and/or a final partial codeword. In one such embodiment, referring again to FIG. 2, the PHY processing unit 200 calculates the minimum number of unshortened codewords according to:

$$N_{CW}^{unshort} = \left\lfloor \frac{(8L + N_{service})}{L_{CW} R} \right\rfloor \quad \text{Equation 15}$$

where L is the number of information bits, $N_{service}$ is the number of service bits, $L_{CW}$ is the codeword length, R is the coding rate, and $\lfloor \; \rfloor$ denotes the integer floor function. In an embodiment, the number of remaining information bits that do not fit into the $N_{CW}^{unshort}$ codewords is determined according to:

$$x = (8L + N_{service}) - N_{CW}^{unshort} L_{CW} R \quad \text{Equation 16}$$

In the case that x is greater than 0, the number of OFDM symbols needed is determined, in an embodiment, according to:

$$N_{SYM} = \left\lceil \frac{N_{CW}^{unshort} L_{CW} + (x + L_{parity})}{N_{CBPS}} \right\rceil \quad \text{Equation 17}$$

where $L_{parity}$ is the number of parity bits per codeword, and $\lceil \; \rceil$ denotes the integer ceiling function. In an embodiment, the number of extra coded bits needed to fill the $N_{SYM}$ OFDM symbols is determined according to:

$$y = N_{SYM} N_{CBPS} - N_{CW}^{unshort} L_{CW} - (x + L_{parity}) \quad \text{Equation 18}$$

The number of padding codewords is determined if needed, in an embodiment, according to:

$$N_{CW}^{extra} = \left\lfloor \frac{x + L_{parity} + y}{L_{CW}} \right\rfloor \quad \text{Equation 19}$$

The number of padding bits necessary to be added before encoding, in an embodiment, is determined according to:

$$p_1 = N_{CW}^{extra} L_{CW} R - x \quad \text{Equation 20}$$

The number of bits remaining (z), where z is less than the codeword length, is determined, in an embodiment, according to:

$$z = (x + L_{parity}) + y - N_{CW}^{unshort} L_{CW} \quad \text{Equation 21}$$

In the case that z is less than or equal to $L_{parity}$, z parity bits from the last codeword are repeated, according to an embodiment. In this case, according to an embodiment, the number of padding bits is determined according to:

$$p = p_1 = N_{CW}^{extra} L_{CW} R - x \quad \text{Equation 22}$$

On the other hand, in the case that z is greater than $L_{parity}$, $L_{CW} - z$ shortening bits are added to $z - L_{parity}$ bits before encoding, and the shortening bits are discarded after encoding, according to an embodiment. In this case, according to an embodiment, the number of padding bits is determined according to:

$$p = p_1 + (z - L_{parity}) = y - N_{CW}^{extra} L_{parity} \quad \text{Equation 23}$$

Alternatively, in another embodiment, referring once again to FIG. 2, the PHY processing 200 performs puncturing of the last codeword to ensure that the information bits fit in an integer number of OFDM symbols. In yet another embodiment, the PHY processing unit 200 repeats information and/or parity bits in the last codeword to ensure that the information bits fit into an integer number of OFDM symbols. In such embodiments, a set of rules is defined such that the receiver is able to determine whether the last codeword was punctured, or if repeating bits were utilized in the encoding process. Alternatively, in another embodiment, shortening is utilized to ensure that the resulting encoded data unit fits in an integer number of OFDM symbols. In an embodiment in which the codeword length is less than the OFDM symbol length, additional dummy codewords are added to fill an entire OFDM symbol. In various embodiments, the receiver utilizes the set of defined rules to calculate the number of codewords based on the number of OFDM symbols and the number of code bits per symbol, and therefore the receiver is able to properly decode the received data unit.

In another embodiment, the PHY processing unit 200 adds padding bits before ("pre-encoding") and after ("post-encoding") the encoding process. In an embodiment, post-encoding padding is done after encoding any suitable number of symbols. For example, padding bits are added after each symbol, after each two symbols, after each 3 symbols, etc. In an embodiment, if the number of required pre-encoding padding bits is greater than eight, extra delimeters are added such that the number of required pre-encoding data bits is between zero and seven.

More specifically, in an embodiment in which pre-encoding and post-encoding padding is performed, the PHY processing unit 200 calculates the minimum number of codewords required to encode the information bits according to Equation 1. In this embodiment, the number of symbols needed to fit the required number of codewords is determined according to Equation 3. The number of transmitted codewords is calculated, in this embodiment, according to:

$$N_{CW} = \left\lceil \frac{N_{SYM} N_{CBPS}}{L_{CW}} \right\rceil \quad \text{Equation 24}$$

According to an embodiment, the number of pre-encoding padding bits is determined according to:

$$N_{pre\text{-}encoding} = L_{CW} N_{CW} R - (8L + N_{service}) \quad \text{Equation 25}$$

In this embodiment, the number of post-encoding padding bits is determined according to:

$$N_{post\text{-}encoding} = N_{SYM} N_{CBPS} - N_{CW} L_{CW} \quad \text{Equation 26}$$

In an embodiment, pre-encoding padding bits and post-encoding padding bits are suitably distributed, according to a set of rules, in all codewords. For example, according to an embodiment, the pre-encoding bits are added, prior to encoding, to the padded information bits, which are then encoded block by block. The post-encoding data bits are added to each encoded block to reach the OFDM symbol boundary. Alternatively, in another embodiment, all of the padding bits are included in the last codeword.

According to another embodiment, the set of rules defined by the VHT protocol is based on the exact number of information bits in the data unit rather than the number of symbols in the data unit, and, therefore, in these embodiments, the client station 25-1 and/or the AP 14 requires knowledge of the exact number of information bits in an LDPC data unit in order to properly decode the data unit. In one such embodiment, with reference to FIG. 3, the VHT-SIGA 258 or the VHT-SIGB 268 is defined such that the field includes an indication of the exact number of information bits whenever LDPC coding is utilized, and the number of symbols whenever BCC coding is utilized. In this embodiment, because an indication of the exact number of information bits in a packet is available at the receiver, any arbitrary set of LDPC codes and/or any arbitrary set of rules (i.e., for padding, shortening, puncturing, repeating, etc.) can be defined such that the receiver is able to unambiguously decode the data unit.

Referring to FIG. 3, in the case that multiple possible codeword lengths are defined for LDPC, VHT-SIGA 258 or VHT-SIGB 268 also includes a field to indicate the particular codeword length utilized for encoding the data unit, according to an embodiment. For example, two bits are defined in the VHT-SIGA 258 and/or VHT-SIGB 268 to indicate coding type, and the values of zero/zero (0) indicate BCC coding, zero/one (01) indicate LDPC coding with a first codeword length, one/zero (10) indicate LDPC coding with a second codeword length, and one/one (11) indicate LDPC coding with a third codeword length. Alternatively, in another embodiment in which multiple codeword lengths are defined, a set of rules for LDPC encoding is defined such that the particular codeword length is determined based the number of OFDM symbols indication.

Referring now to FIG. 1, in some embodiments utilizing the coding techniques described herein, the AP 14 operates in the multi-user multiple input multiple output (MU-MIMO) mode in which a data unit transmitted by the AP 14 includes data directed to more than one of the client stations 25. In one such embodiment, when generating the data unit, the PHY processing unit 200 (FIG. 2) determines the codeword length required for the user with the longest packet, and encodes the entire data unit utilizing the longest sufficient codeword length. In an embodiment, the codeword length is included in the VHT-SIGA 258 field or the VHT-SIGB 268 field as discussed above with reference to FIG. 3. In such embodiments, the number of symbols for users with shorter packets is set to the number of symbols determined for transmitting the longer packet or packets, and the techniques described herein are used to encode the MU data unit accordingly.

Alternatively, in another embodiment in which the AP 14 operates in an MU-MIMO mode, a sufficiently long codeword length (e.g., 1944 bits) is utilized for all data packets for all users. In one such embodiment, VHT-SIGA 258 or VHT-SIGB 268 includes an indication of whether the data unit is a SU data unit or an MU data unit, and therefore the receiver at the client station 25 or the AP 14 is able to determine the codeword length utilized based on the set of rules and the SU/MU indication. Alternatively, in yet another embodiment, a codeword length is determined for each user to which the MU data unit unit is directed, and an indication of the codeword length in the VHT-SIGA 258 field and/or VHT-SIGB 268 field is included for each of the users.

Figure 4:
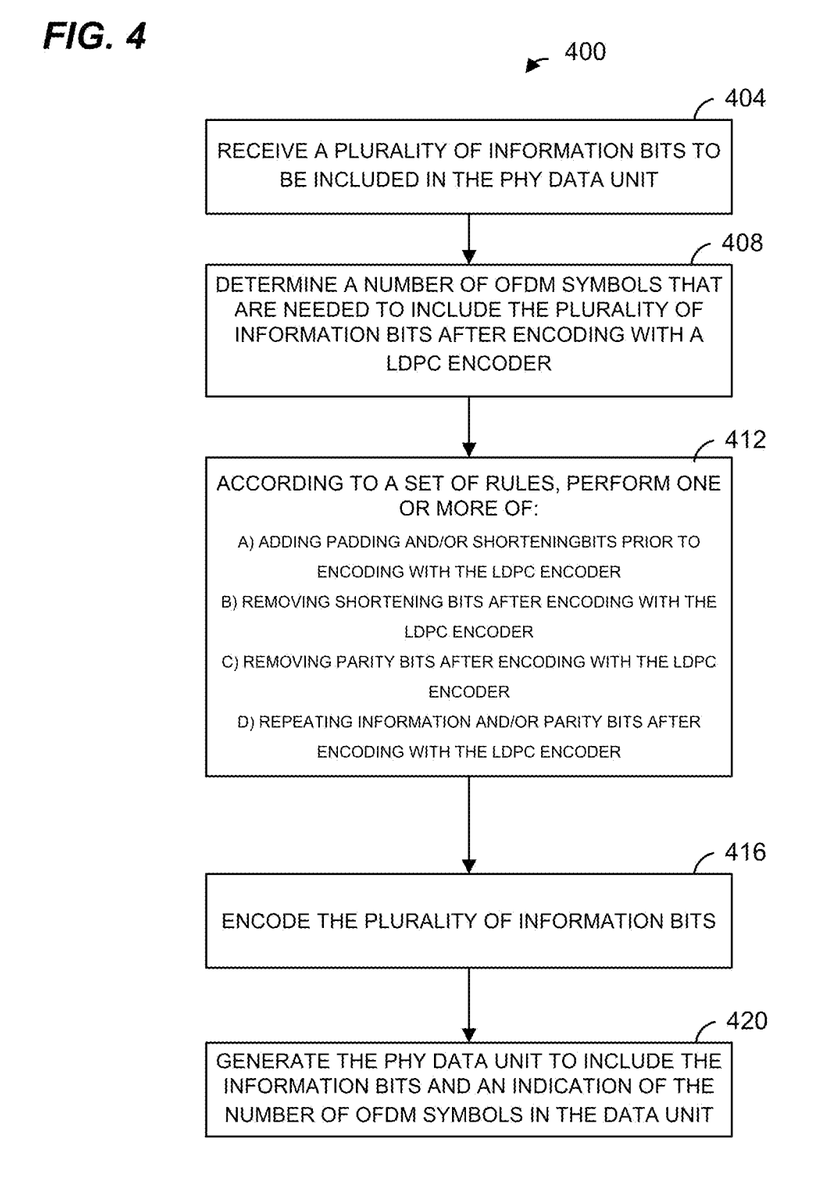
FIG. 4 is a flow diagram of an example method for generating data units, according to an embodiment.

FIG. 4 is a flow diagram of an example method 400 for generating an LDPC encoded data unit according to a set of rules defined based on an indication of the number of OFDM symbols used to transmit the data unit, according to an embodiment. With reference to FIG. 1, the method 400 is implemented by the network interface 16, in an embodiment. For example, in one such embodiment, the PHY processing unit 20 is configured to implement the method 400. According to another embodiment, the MAC processing 18 is also configured to implement at least a part of the method 400. With continued reference to FIG. 1, in yet another embodiment, the method 400 is implemented by the network interface 27 (e.g., the PHY processing unit 29 and/or the MAC processing unit 28). In other embodiments, the method 500 is implemented by other suitable network interfaces.

At block 404, the network interface receives a plurality of information bits to be included in a PHY data unit. At block 408, the number of OFDM symbols that are needed to include the plurality of the information bits is determined. For example, in one embodiment, the number of OFDM symbols is determined by calculating the minimum number of LDPC codewords according to Equation 1, calculating the number of bits that do not fit into the minimum number of LDPC codewords according to Equation 3, and calculating the number of OFDM symbols required to include the information bits based on Equations 3 and 4. As another example, in another embodiment, the number of OFDM symbols is determined by calculating the minimum number of unshortenened LDPC codewords according to Equation 19, calculating the number of the remaining information bits that do not fit in the number of unshortened LDPC codewords according to Equation 20, and calculating the number of OFDM symbols according to Equation 21.

At block 412, the network interface, according to a set of defined rules, implements one or more of a) adding padding bits and/or shortening bits prior to encoding, b) removing shortening bits after encoding, c) removing parity bits after encoding and d) repeating information bits and/or parity bits after encoding. In various embodiments, any suitable combination of one or more of a), b), c) and d) are performed at block 412.

In one embodiment, at block 412, a number of extra encoded bits needed to reach the last OFDM symbol boundary is determined according to Equation 5, a number of additional codewords needed is determined according to Equation 6 and the number of padding bits is determined according to Equation 7. In an embodiment, the number of padding bits determined by Equation 7 is added to the information bits before encoding at block 412.

In an embodiment, also at block 412, a number z is determined according to Equation 8 and the number z is compared to the number of parity bits in a codeword ($L_{parity}$) and to the sum of the minimum number of codewords and the number of extra codewords ($N_{CW}^{min}+N_{CW}^{extra}$), according to an embodiment. For example, in one such embodiment, if z is less than or equal to $L_{parity}$ and is greater than or equal to ($N_{CW}^{min}+N_{CW}^{extra}$), then information and/or parity bits are repeated in each codeword after encoding so that the encoded and padded information bits fit in the determined number of OFDM symbols. Other techniques described above in reference to Equations 1-12 and/or Equations 16-27 are utilized at block 412 in other embodiments and/or scenarios.

At block 416, the plurality of information bits is encoded with an LDPC encoder. For example, the information bits are encoded by the FEC encoders 212 of FIG. 2 in various embodiments in which one or more of the FEC encoders 212 implement LDPC encoding.

At block 420, the PHY data unit is generated. For example, the PHY data unit 250 of FIG. 3 is generated. In an embodiment, an indication of the number of the number OFDM symbols is included in the PHY data unit. For example, the indication of the number of OFDM symbols is included in the preamble portion of the data unit as discussed above with reference to FIG. 3, according to an embodiment.

Figure 5:
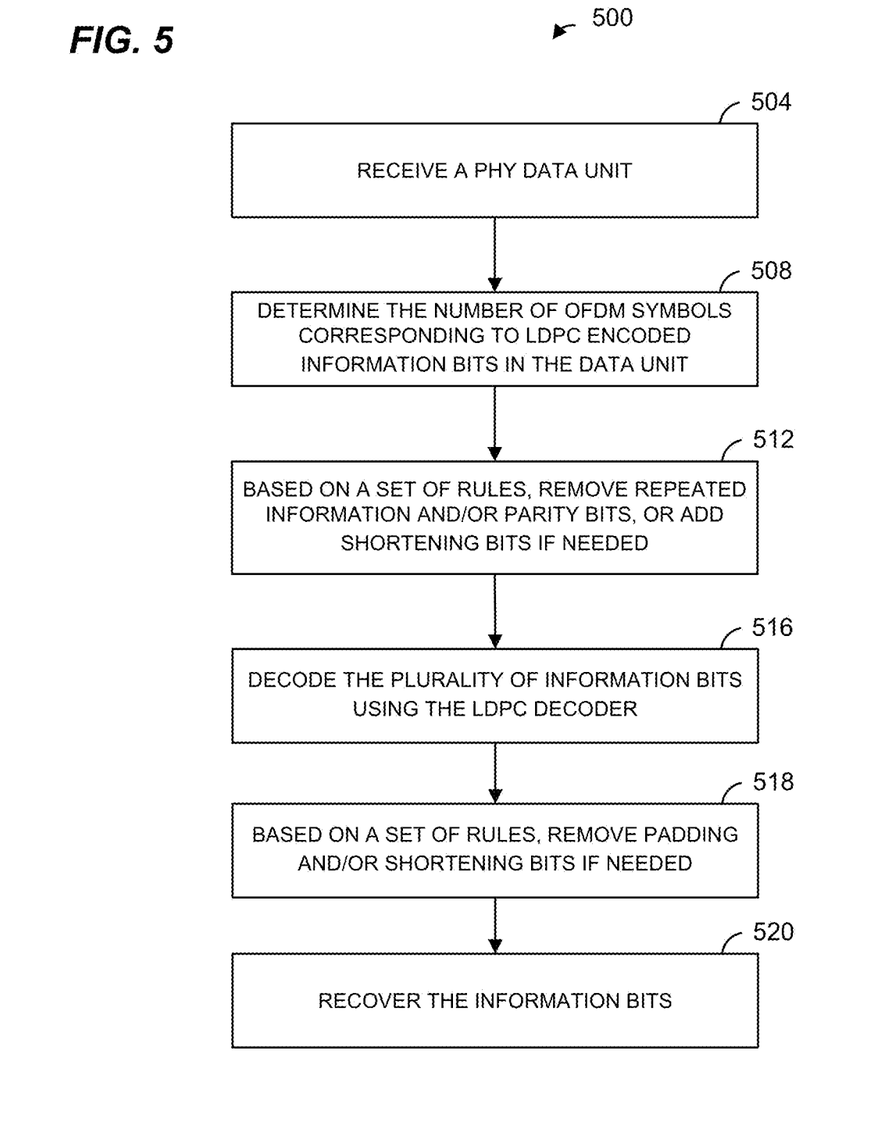
FIG. 5 is a flow diagram of an example method for decoding information bits included in data units, according to an embodiment.

FIG. 5 is a flow diagram of an example method 500 for decoding information bits included in a PHY data unit received via a communication channel, according to an embodiment. With reference to FIG. 1, the method 500 is implemented by the network interface 16, in an embodiment. For example, in one such embodiment, the PHY processing unit 20 is configured to implement the method 500. According to another embodiment, the MAC processing 18 is also configured to implement at least a portion of the method 500. With continued reference to FIG. 1, in yet another embodiment, the method 500 is implemented by the network interface 27 (e.g., the PHY processing unit 29 and/or the MAC processing unit 28). In other embodiments, the method 500 is implemented by other suitable network interfaces.

At block 504, an LDPC encoded PHY data unit is received via a communication channel, according to an embodiment. At block 508, the number of OFDM symbols corresponding to LDPC encoded information bits is determined. For example, the number of OFDM symbols is determined based on an indication included in a preamble of the data unit. At block 512, it is determine if repeated information and/or parity bits need to be removed from one or more of the OFDM symbols or if shortening bits need to be added to one or more of the OFDM symbols before decoding. In an embodiment, the determination of block 512 is based on the number of OFDM symbols and based on a defined set of rules. For example, in an embodiment, z is calculated according to Equation 13 and compared to the number of parity bits ($L_{parity}$) in a codeword. If, for example, z is less than or equal to $L_{parity}$ it is determined that z repetition bits need to be removed from at least some codeword. As another example, if z is greater than $L_{parity}$ it is determined that shortening bits need to be added to at least some of the codewords.

At block 516, the plurality of information bits is decoded using the LDPC decoder. At block 518, any padding and/or shortening bits that were added before decoding are removed. In an embodiment, a determination of the padding and/or shortening bits that were added before decoding is based on the number of OFDM symbols and/or based on a defined set of rules. At block 520, the information bits are recovered.

At least some of the various blocks, operations, and techniques described above may be implemented utilizing hardware, a processor executing firmware instructions, a processor executing software instructions, or any combination thereof. When implemented utilizing a processor executing software or firmware instructions, the software or firmware instructions may be stored in any computer readable memory such as on a magnetic disk, an optical disk, or other storage medium, in a RAM or ROM or flash memory, processor, hard disk drive, optical disk drive, tape drive, etc. Likewise, the software or firmware instructions may be delivered to a user or a system via any known or desired delivery method including, for example, on a computer readable disk or other transportable computer storage mechanism or via communication media. Communication media typically embodies computer readable instructions, data structures, program modules or other data in a modulated data signal such as a carrier wave or other transport mechanism. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency, infrared and other wireless media. Thus, the software or firmware instructions may be delivered to a user or a system via a communication channel such as a telephone line, a DSL line, a cable television line, a fiber optics line, a wireless communication channel, the Internet, etc. (which are viewed as being the same as or interchangeable with providing such software via a transportable storage medium). The software or firmware instructions may include machine readable instructions that, when executed by the processor, cause the processor to perform various acts.

When implemented in hardware, the hardware may comprise one or more of discrete components, an integrated circuit, an application-specific integrated circuit (ASIC), etc.

While the present invention has been described with reference to specific examples, which are intended to be illustrative only and not to be limiting of the invention, changes, additions and/or deletions may be made to the disclosed embodiments without departing from the scope of the invention.

What is claimed:

1. A method for generating a physical layer (PHY) data unit for transmission via a communication channel, the method comprising:

receiving a plurality of information bits to be included in the PHY data unit;

determining a number of orthogonal frequency division multiplexing (OFDM) symbols that are needed to transmit the plurality of information bits after encoding with a low density parity check (LDPC) encoder;

performing one or more of a, b, c, d, e, and f according to a set of rules so that a receiving device can determine a number of information bits in the PHY data unit based on i) an indication of the number of OFDM symbols, and ii) the set rules:

a) adding padding bits prior to encoding with the LDPC encoder, b) adding shortening bits prior to encoding with the LDPC encoder, c) removing the shortening bits after encoding with the LDPC encoder, d) performing puncturing, e) repeating information bits after encoding with the LDPC encoder, and f) repeating parity bits after encoding with the LDPC encoder;

encoding the plurality of information bits using the LDPC encoder; and generating the PHY data unit i) to include the LDPC encoded information bits in OFDM symbols and ii) to include an indication of the number of OFDM symbols in the PHY data unit, wherein performing one or more of a, b, c, d, e, and f according to the set of rules comprises:

determining a number of extra encoded bits needed to reach a last OFDM symbol boundary according to:

$$y = N_{SYM} N_{CBPS} - N_{CW}^{min} L_{CW} - (x + L_{parity});$$

determining a number of additional codewords according to $$N_{CW}^{extra} = \left\lfloor \frac{x + L_{parity} + y}{L_{CW}} \right\rfloor;$$

determining a number of padding bits to be added before encoding according to:

$p_1 = N_{CW}^{extra} L_{CW} R - x$; and adding $p_1$ padding bits to the plurality of information before encoding.

2. A method according to claim 1, wherein determining the number of OFDM symbols comprises:

calculating a minimum number of LDPC codewords according to $$N_{CW}^{min} = \left\lfloor \frac{(8L + N_{service})}{L_{CW} R} \right\rfloor;$$

calculating a number of remaining information bits according to $x = (8L + N_{service}) - N_{CW}^{min} L_{CW} R;$ and calculating the number of OFDM symbols according to:

$$N_{SYM} = \begin{cases} \left\lceil \frac{N_{CW}^{min} L_{CW} + (x + L_{parity})}{N_{CBPS}} \right\rceil & x > 0 \\ \left\lceil \frac{N_{CW}^{min} L_{CW}}{N_{CBPS}} \right\rceil & x = 0 \end{cases}$$

wherein
$N_{CW}^{min}$ is the minimum number of LDPC codewords,
L is a number of octets in the plurality of information bits,
R is a code rate of the LDPC encoder,
$N_{service}$ is a number of service bits,
$L_{CW}$ is a length of an LDPC codeword in bits,
x is the number of remaining information bits after encoding information bits in the minimum number of LDPC codewords, $N_{CW}^{min}$,
$N_{CBPS}$ is a number of encoded bits per OFDM symbol
$L_{parity}$ is a number of parity bits in each LDPC codeword in bits, and
$N_{SYM}$ is the number of OFDM symbols.

3. A method according to claim 1, wherein performing one or more of a, b, c, d, e, and f according to the set of rules comprises:

determining a number z corresponding to a number of padding bits to add after encoding according to:

$z = (x + L_{parity}) + y - N_{CW}^{extra} \cdot L_{CW} = N_{SYM} N_{CBPS} - (N_{CW}^{min} + N_{CW}^{extra}) L_{CW};$ when $z <= L_{parity}$ and $z >= (N_{CW}^{min} + N_{CW}^{extra})$, repeating information and/or parity bits after encoding with the LDPC encoder in each codeword so that encoded and padded information bits fit in $N_{SYM}$ OFDM symbols;
when $z <= L_{parity}$ and $z < (N_{CW}^{min} + N_{CW}^{extra})$, repeating one information or parity bit after encoding in each of a first z codewords;
when $z > L_{parity}$,
calculate a number of shortening bits according to $N_{shrt} = (L_{CW} - z)$,
distributing the shortening bits among $(N_{CW}^{min} + N_{CW}^{extra} + 1)$ codewords before encoding, and
removing the shortening bits after encoding.

4. A method according to claim 1, wherein performing one or more of a, b, c, d, e, and f according to the set of rules comprises:

determining a number z corresponding to a number of padding bits to add after encoding;
when $z <= L_{parity}$, performing one or both of (i) repeating information and (ii) repeating parity bits after encoding with the LDPC encoder in only a last codeword so that encoded and padded information bits fit in $N_{SYM}$ OFDM symbols;
when $z > L_{parity}$,
forming a codeword with $z - L_{parity}$ padding bits and $N_{shrt} = (L_{CW} - z)$ shortening bits, and
removing the shortening bits after encoding.

5. A communication device having a network interface, wherein the network interface is configured to:

receive a plurality of information bits to be included in a physical layer (PHY) data unit for transmission via a wireless communication channel, determine a number of orthogonal frequency division multiplexing (OFDM) symbols that are needed to transmit the plurality of information bits after encoding with a low density parity check (LDPC) encoder, perform one or more of a, b, c, d, e, and f according to a set of rules so that a receiving device can determine a number of information bits in the PHY data unit based on i) an indication of the number of OFDM symbols, and ii) the set rules:

a) add padding bits prior to encoding with the LDPC encoder, b) add shortening bits prior to encoding with the LDPC encoder, c) remove the shortening bits after encoding with the LDPC encoder, d) perform puncturing, e) repeat information bits after encoding with the LDPC encoder, and f) repeat parity bits after encoding with the LDPC encoder;

wherein the network interface is further configured to:

encode the plurality of information bits using the LDPC encoder, generate the PHY data unit i) to include the LDPC encoded information bits in OFDM symbols and ii) to include an indication of the number of OFDM symbols in the PHY data unit, determine a number of extra encoded bits needed to reach a last OFDM symbol boundary according to:

$y = N_{SYM} N_{CBPS} - N_{CW}^{min} L_{CW} - (x + L_{parity}),$ determine a number of additional codewords according to:

$$N_{CW}^{extra} = \left\lfloor \frac{x + L_{parity} + y}{L_{CW}} \right\rfloor,$$

determine a number of padding bits to be added before encoding according to:

$p_1 = N_{CW}^{extra} \cdot L_{CW} \cdot R - x,$ and add $p_1$ padding bits to the plurality of information before encoding.

6. A communication device according to claim 5, wherein the network interface is configured to:

calculate a minimum number of LDPC codewords according to $$N_{CW}^{min} = \left\lfloor \frac{(8L + N_{service})}{L_{CW}R} \right\rfloor,$$

calculate a number of remaining information bits according to $$x = (8L + N_{service}) - N_{CW}^{min} L_{CW} R,$$

and calculate the number of OFDM symbols according to:

$$N_{SYM} = \begin{cases} \left\lceil \dfrac{N_{CW}^{min} L_{CW} + (x + L_{parity})}{N_{CBPS}} \right\rceil & x > 0 \\ \left\lceil \dfrac{N_{CW}^{min} L_{CW}}{N_{CBPS}} \right\rceil & x = 0 \end{cases}$$

wherein $N_{CW}^{min}$ is the minimum number of LDPC codewords,

L is a number of octets in the plurality of information bits,

R is a code rate of the LDPC encoder, $N_{service}$ is a number of service bits, $L_{CW}$ is a length of an LDPC codeword in bits, x is the number of remaining information bits after encoding information bits in the minimum number of LDPC codewords, $N_{CW}^{min}$, $N_{CBPS}$ is a number of encoded bits per OFDM symbol $L_{parity}$ is a number of parity bits in each LDPC codeword in bits, and $N_{SYM}$ is the number of OFDM symbols.

7. A communication device according to claim 5, wherein the network interface is configured to:

determine a number z corresponding to a number of padding bits to add after encoding according to:

$$z = (x + L_{parity}) + y - N_{CW}^{extra} \cdot L_{CW} = N_{SYM} N_{CBPS} - (N_{CW}^{min} + N_{CW}^{extra}) L_{CW},$$

when $z L_{parity}$ and $z >= (N_{CW}^{min} + N_{CW}^{extra})$, repeat information and/or parity bits after encoding with the LDPC encoder in each codeword so that encoded and padded information bits fit in $N_{SYM}$ OFDM symbols, when $z L_{parity}$ and $z < (N_{CW}^{min} + N_{CW}^{extra})$, repeat one information or parity bit after encoding in each of a first z codewords, when $z > L_{parity}$, calculate a number of shortening bits according to $N_{shrt} = (L_{CW} - z)$, distribute the shortening bits among $(N_{CW}^{min} + N_{CW}^{extra} 1)$ codewords before encoding, and remove the shortening bits after encoding.

8. A communication device according to claim 5, wherein the network interface is configured to:

determine a number z corresponding to a number of padding bits to add after encoding;

when $z <= L_{parity}$, perform one or both of (i) repeat information (ii) repeat parity bits after encoding with the LDPC encoder in only a last codeword so that encoded and padded information bits fit in $N_{SYM}$ OFDM symbols, when $z > L_{parity}$, form a codeword with $z - L_{parity}$ padding bits and $N_{shrt} = (L_{CW} - z)$ shortening bits, and remove the shortening bits after encoding.

* * * * *